United States Patent
Mitsuhashi

(10) Patent No.: US 10,132,872 B2
(45) Date of Patent: Nov. 20, 2018

(54) METHOD FOR SORTING REUSABLE NONAQUEOUS ELECTROLYTE SECONDARY BATTERY

(71) Applicant: TOYOTA JIDOSHA KABUSHIKI KAISHA, Toyota-shi, Aichi (JP)

(72) Inventor: Toshihiko Mitsuhashi, Nagoya (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 87 days.

(21) Appl. No.: 15/249,549

(22) Filed: Aug. 29, 2016

(65) Prior Publication Data
US 2017/0059664 A1    Mar. 2, 2017

(30) Foreign Application Priority Data
Aug. 31, 2015  (JP) .................................. 2015-171348

(51) Int. Cl.
| | |
|---|---|
| *G01R 31/36* | (2006.01) |
| *B60L 11/18* | (2006.01) |
| *H01M 10/05* | (2010.01) |
| *H01M 10/42* | (2006.01) |
| *H01M 10/052* | (2010.01) |

(52) U.S. Cl.
CPC ...... *G01R 31/3662* (2013.01); *B60L 11/1879* (2013.01); *G01R 31/3675* (2013.01); *G01R 31/3679* (2013.01); *H01M 10/05* (2013.01); *H01M 10/4242* (2013.01); *H01M 10/052* (2013.01); *Y02W 30/84* (2015.05)

(58) Field of Classification Search
CPC ........... G01R 31/3662; G01R 31/3679; G01R 31/3675; H01M 10/05; H01M 10/4242; H01M 10/052; B60L 11/1879; Y02W 30/84

USPC ............................................ 324/430; 307/9.1
See application file for complete search history.

(56) References Cited

U.S. PATENT DOCUMENTS

2013/0015702 A1* 1/2013 Ito .................. H01M 10/482
                                                      307/9.1
2014/0015537 A1    1/2014 Uchida et al.

FOREIGN PATENT DOCUMENTS

| JP | 2014-20818 A | 2/2014 |
| JP | 5768754 B2 | 8/2015 |
| KR | 10-2012-0088957 A | 8/2012 |

* cited by examiner

*Primary Examiner* — Farhana Hoque
(74) *Attorney, Agent, or Firm* — Sughrue Mion, PLLC

(57) ABSTRACT

Provided is a method by which the sorting as to whether a spent nonaqueous electrolyte secondary battery with the degraded input/output characteristics can be reused can be realized more accurately by taking into consideration the degradation of the input/output characteristics which is caused by the salt concentration unevenness and liquid shortage in the electrode body. The method for sorting a reusable nonaqueous electrolyte secondary battery, which is disclosed herein, includes: a preparation step of preparing a spent nonaqueous electrolyte secondary battery having a positive electrode and a negative electrode; a high-temperature storage step of storing the prepared nonaqueous electrolyte secondary battery for a predetermined time under a high-temperature condition; and a determination step of determining, on the basis of an internal resistance measured after the high-temperature storage step, whether or not the nonaqueous electrolyte secondary battery which has been stored at a high temperature can be reused.

5 Claims, 5 Drawing Sheets

METHOD FOR SORTING REUSABLE NONAQUEOUS ELECTROLYTE SECONDARY BATTERY

BACKGROUND OF THE INVENTION

1. Field of the Invention

The present teaching relates to a method for sorting a reusable nonaqueous electrolyte secondary battery from spent nonaqueous electrolyte secondary batteries. The present application claims priority to Japanese Patent Application No. 2015-171348 filed on Aug. 31, 2015, the entire contents of which are hereby incorporated by reference.

2. Description of the Related Art

Nonaqueous electrolyte secondary batteries such as lithium ion secondary batteries have been used in recent years as the so-called portable power sources for personal computers, portable terminals, and the like, and as drive power sources for vehicles. When nonaqueous electrolyte secondary batteries are used as a drive power source for vehicles, they are used as a battery pack in which a plurality of nonaqueous electrolyte secondary batteries (unit batteries) are electrically connected to each other. Accordingly, the demand for nonaqueous electrolyte secondary batteries has been steadily growing.

Nonaqueous electrolyte secondary batteries that have reached a service life need to be replaced, and as the demand for the batteries grows, the number of spent nonaqueous electrolyte secondary batteries is expected to rise. Accordingly, from the standpoint of efficiently reusing the resources and reducing the running cost, it is necessary to establish a method for accurately determining whether a battery can be reused by accurately detecting the degradation state of spent nonaqueous electrolyte secondary batteries. In this respect, for example, Japanese Patent Application Publication No. 2014-020818 discloses the feature of using the open circuit voltage value, internal resistance value, and full charge capacity value of each of the batteries constituting a battery pack, as indicators for determining the reusability of the nonaqueous electrolyte secondary batteries.

SUMMARY OF THE INVENTION

In the battery pack reusability determination method disclosed in Japanese Patent Application Publication No. 2014-020818, the internal resistance is taken as a determination indicator. The investigation conducted by the inventor has demonstrated that the increase in the internal resistance of batteries can be caused by factors other than the end of the battery service life. Thus, in the batteries after they have been used in the market, etc., an electrolytic solution sometimes flows out from inside of an electrode body under the effect of expansion and contraction of an electrode active material or due to heat generation. As a result, the internal resistance of the battery can increase due to the so-called salt concentration unevenness or liquid shortage inside the electrode body. The increase in the internal resistance of the battery caused by the salt concentration unevenness or liquid shortage is reversible, and where the salt concentration unevenness or liquid shortage is eliminated or the degree thereof is reduced, the nonaqueous electrolyte secondary battery can be restored to the usable state. However, with the determination method disclosed in Japanese Patent Application Publication No. 2014-020818, it is impossible to determine whether the increase in the internal resistance of a spent secondary battery, which is the determination object of the method, is caused by the salt concentration unevenness or liquid shortage. As a result, an inherently reusable battery can be diagnosed as unreusable.

Accordingly, it is an objective of the present teaching to provide a method by which the sorting as to whether a spent nonaqueous electrolyte secondary battery with the degraded input/output characteristics can be reused can be realized more accurately by taking into consideration the degradation of the input/output characteristics which is caused by the salt concentration unevenness and liquid shortage.

A method for sorting a reusable nonaqueous electrolyte secondary battery, which is disclosed herein, includes: a preparation step of preparing a spent nonaqueous electrolyte secondary battery having a positive electrode and a negative electrode; a high-temperature storage step of storing the prepared nonaqueous electrolyte secondary battery for a predetermined time under a high-temperature condition; and a determination step of determining, on the basis of an internal resistance, whether or not the nonaqueous electrolyte secondary battery which has been stored at a high temperature can be reused.

It has been confirmed that with such features, the degradation of the input/output characteristics which is caused by the salt concentration unevenness and liquid shortage inside an electrode body can be recovered, and therefore it is possible to sort the degradation state of the nonaqueous electrolyte secondary battery with good accuracy and determine whether or not the nonaqueous electrolyte secondary battery can be reused. In the present specification, the high-temperature condition in the high-temperature storage step indicates, for example, 40° C. to 75° C.

In the desired aspect of the method for sorting a reusable nonaqueous electrolyte secondary battery disclosed herein, the high-temperature storage step is implemented at 60° C. to 75° C. under the atmospheric pressure.

With such a feature, the salt concentration unevenness and liquid shortage can be effectively eliminated due to the decrease in the viscosity of the electrolytic solution or as a result of convection.

In the desired aspect of the method for sorting a reusable nonaqueous electrolyte secondary battery disclosed herein, the high-temperature storage step is implemented within a range from 8 hours (inclusive) to 48 hours (inclusive).

With such a feature, the salt concentration unevenness or liquid shortage which has occurred inside the nonaqueous electrolyte secondary battery can be at least partially recovered, while suppressing the possibility of the battery material degradation occurring in the course of the high-temperature storage.

In the desired aspect of the method for sorting a reusable nonaqueous electrolyte secondary battery, an advance estimation step of measuring in advance an internal resistance of the spent nonaqueous electrolyte secondary battery is provided before the high-temperature storage step, and whether or not the nonaqueous electrolyte secondary battery is reusable is determined by comparing the internal resistance of the nonaqueous electrolyte secondary battery measured in the advance estimation step with a preset threshold.

With such a feature, a battery with a low internal resistance can be determined as reusable, without implementing the high-temperature storage step. Therefore, the high-temperature storage step and determination step are not required for such batteries. As a consequence, the number of steps can be decreased as a whole and cost can be reduced.

In the desired aspect of the method for sorting a reusable nonaqueous electrolyte secondary battery, the temperature of the nonaqueous electrolyte secondary battery at the time of measuring the internal resistance of the nonaqueous electrolyte secondary battery after the high-temperature storage step is made equal to the temperature of the nonaqueous electrolyte secondary battery at the time of measuring the internal resistance of the nonaqueous electrolyte secondary battery in the advance estimation step.

With such a feature, the measured error caused by the difference between the temperature of the nonaqueous electrolyte secondary battery in the advance estimation step and the temperature of the nonaqueous electrolyte secondary battery after the high-temperature storage step can be suppressed. As a result, it is possible to determine with better accuracy whether or not the nonaqueous electrolyte secondary battery is reusable.

DESCRIPTION OF THE PREFERRED EMBODIMENTS

Figure 1:
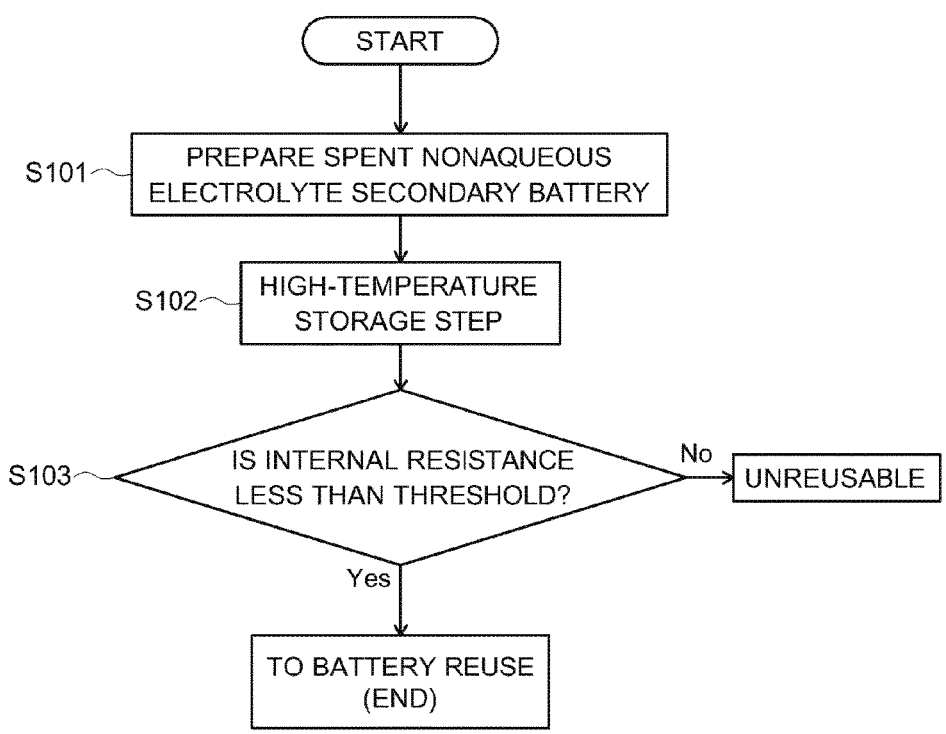
FIG. 1 is a flowchart illustrating the flow of the method for sorting a reusable nonaqueous electrolyte secondary battery in accordance with the present teaching.

FIG. 1 is a flowchart illustrating the flow of the method for sorting a reusable nonaqueous electrolyte secondary battery in accordance with the present teaching. The method for sorting a reusable nonaqueous electrolyte secondary battery disclosed herein includes: a preparation step (step S101) of preparing a spent nonaqueous electrolyte secondary battery having a positive electrode and a negative electrode; a step (step S102) of storing the prepared nonaqueous electrolyte secondary battery for a predetermined time under a high-temperature condition; and a determination step (step S103) of determining, on the basis of the internal resistance, whether or not the nonaqueous electrolyte secondary battery which has been stored at a high temperature can be reused. The nonaqueous electrolyte secondary batteries which have been determined in step S103 to be reusable may be reused by electrically connecting a plurality of the nonaqueous electrolyte secondary batteries to obtain a battery pack. The high-temperature condition in step S102 indicates, for example, a temperature range of 40° C. to 75° C.

The method for sorting a reusable nonaqueous electrolyte secondary battery disclosed herein will be explained hereinbelow in detail with reference to the drawings on the basis of specific embodiments thereof. The present teaching is obviously not intended to be particularly limited to the embodiments explained herein. It should be noted that matters necessary for carrying out the present teaching other than those specifically referred to in the description are understood to be matters of design for a person skilled in the art which are based on the related art in the pertinent field. Further, the drawings are drawn schematically; for example, the dimensional relationships (length, width, height, etc.) in the drawings do not reflect actual dimensional relationships.

The term "secondary battery" in the present specification typically refers to cyclically rechargeable power storage devices and is inclusive of the so-called power storage elements such as storage batteries and electric double layer capacitors. The "lithium ion secondary battery" in the present specification refers to a secondary battery which uses lithium ions as charge carriers and in which charging and discharging is realized by the movement of electric charges carried by lithium ions between positive and negative electrodes.

Initially, the structure of a nonaqueous electrolyte secondary battery (in this case, lithium ion secondary battery) 100 which is used in the sorting method of the present embodiment will be explained below in a simple manner with reference to FIGS. 2 and 3. In the present embodiment, an angular lithium ion secondary battery having a wound electrode body is considered by way of example, but the method for sorting a reusable nonaqueous electrolyte secondary battery which is disclosed herein is not limited to the lithium ion secondary battery, and for example a sodium ion secondary battery may be used. Further, a battery using a stacked electrode body obtained by laminating a plurality of negative electrodes, a plurality of separators, and a plurality of positive electrodes may be used, or a cylindrical nonaqueous electrolyte secondary battery may be used.

A battery pack constituted by a plurality of nonaqueous electrolyte secondary batteries may be used, as is, in the below-described high-temperature storage step.

Figure 3:
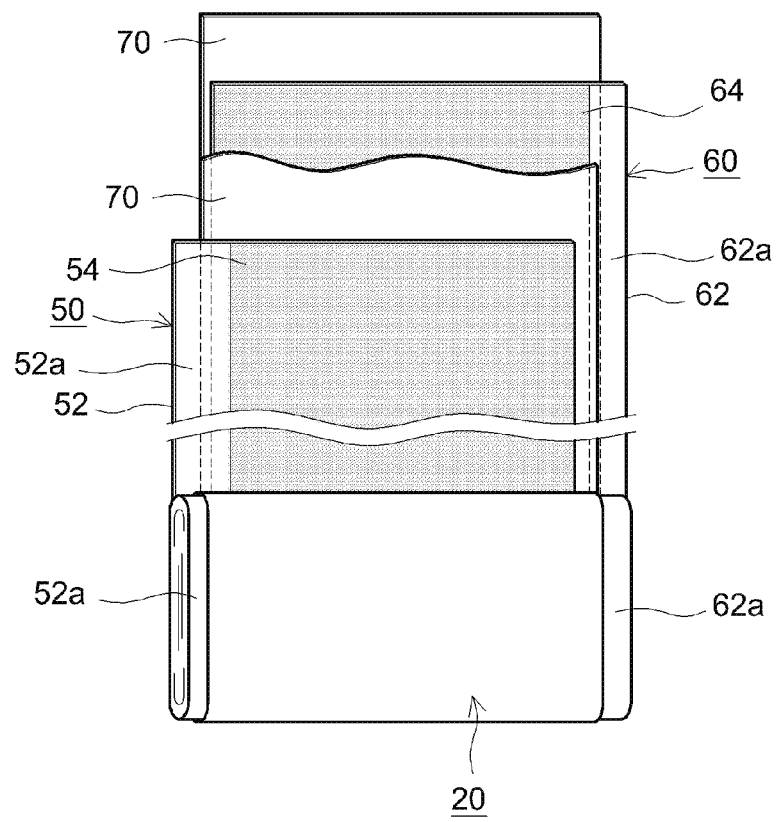
FIG. 3 is a schematic diagram illustrating the entire configuration of the wound electrode body of a reusable nonaqueous electrolyte secondary battery which is sorted in an embodiment of the present teaching.

In the lithium ion secondary battery 100 depicted in FIG. 3, a flat wound electrode body 20 and a nonaqueous electrolytic solution (not depicted in the figure) are generally housed in a sealed battery case (that is, an outer case) 30 of a flat angular shape. The battery case 30 is constituted by a box-like (that is, a bottomed rectangular parallelepiped) case main body 32 having an opening at one end (corresponds to the upper end in the usual usage state of the battery), and a lid 34 that seals the opening of the case main body 32. For example, a lightweight metal material with good thermal conductivity, such as aluminum, stainless steel, and nickel-plated steel, can be advantageously used for the battery case 30.

Further, as depicted in FIG. 3, the lid 34 is provided with a positive electrode terminal 42 and a negative electrode terminal 44 for external connection, a thin-wall safety valve 36 which is set such as to release the internal pressure of the battery case 30 when the internal pressure rises to a predetermined level or thereabove, and a pouring hole (not depicted in the figure) for pouring the nonaqueous electrolytic solution. Moreover, a current interrupt device (CID) that is actuated by the increase in the internal pressure of the battery case 30 may be provided inside the battery case 30.

Figure 4:
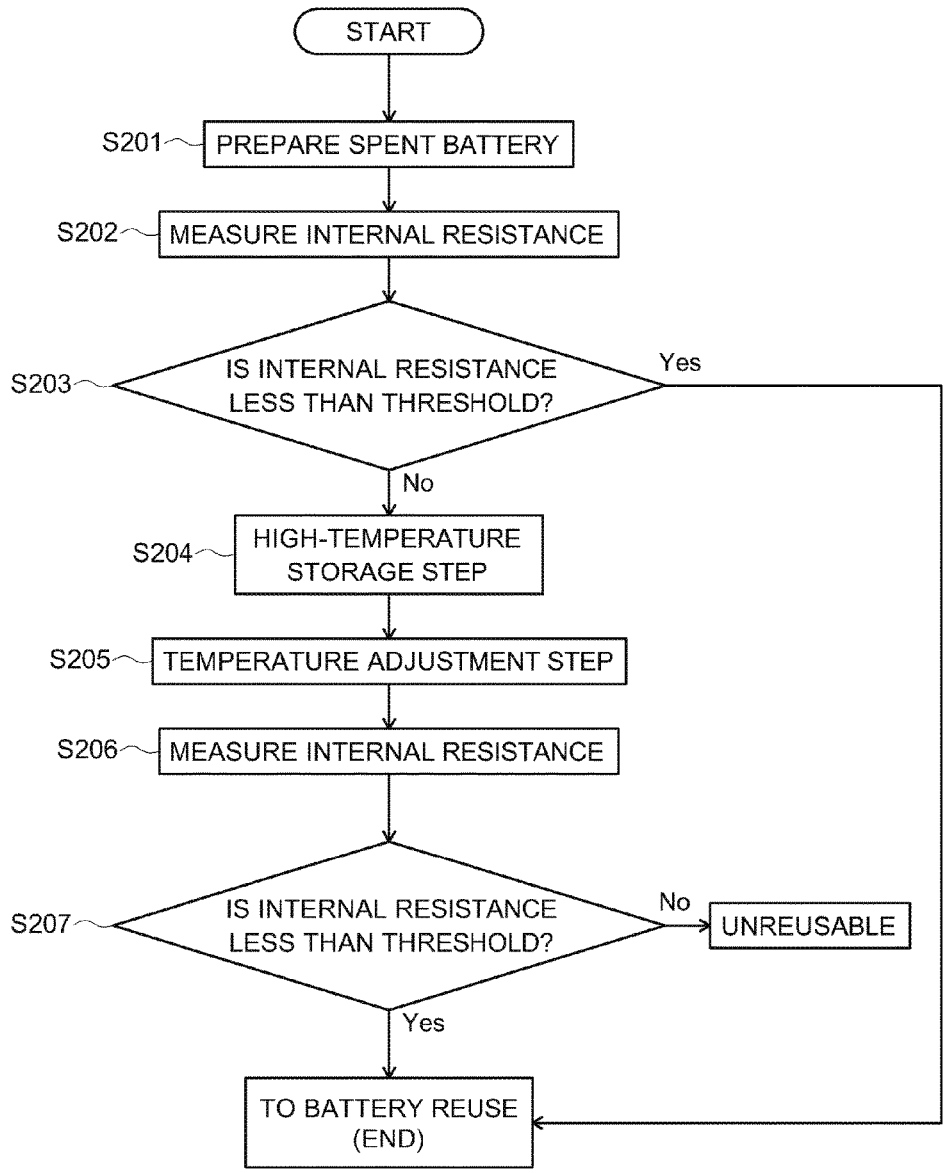
FIG. 4 is a flowchart illustrating the flow of the method for sorting a reusable nonaqueous electrolyte secondary battery according to an embodiment of the present teaching.

As depicted in FIGS. 3 and 4, the wound electrode body 20 disclosed herein is obtained by preparing a positive electrode 50 in which a positive electrode active material layer 54 is formed along the longitudinal direction on one or two surfaces (in this case, on two surfaces) of an elongated positive electrode collector 52, and a negative electrode 60 in which a negative electrode active material layer 64 is formed along the longitudinal direction on one or two surfaces (in this case, on two surfaces) of an elongated negative electrode collector 62, laminating the positive electrode and negative electrode, with two elongated separators 70 being interposed therebetween, winding the laminate in the longitudinal direction, and forming the resultant into a flat shape.

Figure 2:
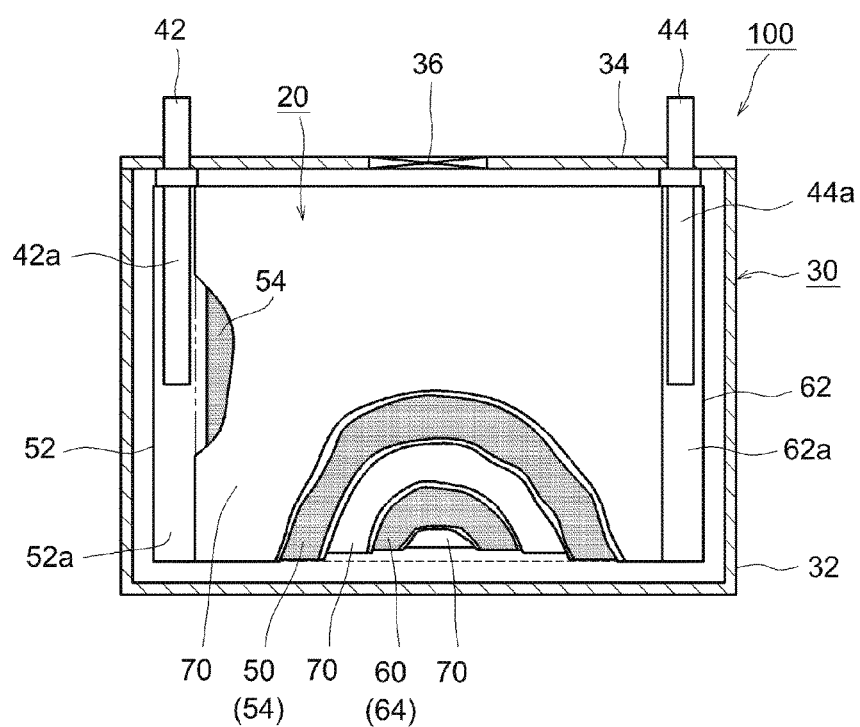
FIG. 2 is a cross-sectional view illustrating schematically the internal structure of a reusable nonaqueous electrolyte secondary battery which is sorted in an embodiment of the present teaching.

As depicted in FIGS. 2 and 3, a wound core portion (that is, the laminated structure in which the positive electrode active material layer 54 of the positive electrode 50, the negative electrode active material layer 64 of the negative electrode 60, and the separators 70 are laminated) is formed in the central portion, in the winding axis direction, of the wound electrode body 20. Parts of a positive electrode active material layer non-formation portion 52a and a negative electrode active material layer non-formation portion 62a protrude outward from the wound core portion at both ends, in the winding axis direction, of the wound electrode body 20. A positive electrode collector 42a and a negative electrode collector 44a are provided at the protruding portion on the positive electrode side (positive electrode active material layer non-formation portion 52a) and the protruding portion on the negative electrode side (negative electrode active material layer non-formation portion 62a), respectively, and electrically connected to the positive electrode terminal 42 and the negative electrode terminal 44, respectively.

For example, an aluminum foil can be used as the positive electrode collector 52 constituting the positive electrode 50. The positive electrode active material layer 54 includes at least a positive electrode active material. Examples of the positive electrode active material include lithium composite metal oxides of a layered structure or spinel structure (for example, $LiNi_{1/3}Co_{1/3}Mn_{1/3}O_2$, $LiNiO_2$, $LiCoO_2$, $LiFeO_2$, $LiMn_2O_4$, $LiNi_{0.5}Mn_{1.5}O_4$, and $LiFePO_4$). The positive electrode active material layer 54 can include components other than the active material, for example, an electrically conductive material or a binder. A carbon black such as acetylene black (AB) and other carbon materials (graphite, etc.) can be advantageously used as the electrically conductive material. Polyvinylidene fluoride (PVdF) can be used as the binder.

Such a positive electrode 50 can be fabricated, for example, in the following manner. Initially, the positive electrode active material and an optional material are dispersed in an appropriate solvent (for example, N-methyl-2-pyrrolidone) to prepare a paste-like (slurry-like) composition. The appropriate amount of the composition is then applied to the surface of the positive electrode collector 52, and the solvent is then removed by drying. The properties (for example, average thickness, active material density, and porosity) of the positive electrode active material layer 54 can be adjusted, as necessary, by performing appropriate press processing.

For example, a copper foil can be used as the negative electrode collector 62 constituting the negative electrode 60. The negative electrode active material layer 64 includes at least a negative electrode active material. Examples of the negative electrode active material include carbon materials such as graphite, hard carbon, and soft carbon. The negative electrode active material layer 64 can include components other than the active material, for example, a binder and a thickening agent. A styrene-butadiene rubber (SBR) can be used as the binder. For example, carboxymethyl cellulose (CMC) can be used as the thickening agent.

The negative electrode 60 can be fabricated, for example, in the same manner as the positive electrode 50. Thus, the negative electrode active material and an optional material are dispersed in an appropriate solvent (for example, ion-exchange water) to prepare a paste-like (slurry-like) composition, the appropriate amount of the composition is applied to the surface of the negative electrode collector 62, and the solvent is removed by drying. The properties (for example, average thickness, active material density, and porosity) of the negative electrode active material layer 64 can be adjusted, as necessary, by performing appropriate press processing.

For example, a porous sheet (film) constituted by a resin such as polyethylene (PE), polypropylene (PP), a polyester, cellulose, and a polyamide can be used as the separator 70. The porous sheet may have a monolayer structure or a laminated structure constituted by two or more layers (for example, a three-layer structure in which a PP layer is laminated on each surface of a PE layer). A heat-resistance layer (HRL) may be provided on the surface of the separator 70.

An organic solvent (nonaqueous solvent) including a support salt typically can be used as the nonaqueous electrolytic solution. Various organic solvents such as carbonates, ethers, esters, nitriles, sulfones, and lactones, which can be used in an electrolytic solution of a typical lithium ion secondary battery, can be used without any particular limitation. Specific examples thereof include ethylene carbonate (EC), propylene carbonate (PC), diethyl carbonate (DEC), dimethyl carbonate (DMC), and ethylmethyl carbonate (EMC). Such nonaqueous solvents can be used individually or in combinations of two or more thereof. For example, a lithium salt such as $LiPF_6$, $LiBF_4$, and $LiClO_4$ can be advantageously used as the support salt. $LiPF_6$ is a particularly desired support salt. The concentration of the support salt is desirably no less than 0.7 mol/L and no more than 1.3 mol/L.

The nonaqueous electrolytic solution can include components other than the above-described nonaqueous solvent and support salt, for example, various additives such as a gas-generating agent such as biphenyl (BP) and cyclohexylbenzene (CHB); a film-forming agent such as an oxalate complex compound including a boron atom and/or a phosphorus atom, vinylene carbonate (VC), and fluoroethylene carbonate (FEC); a dispersant; and a thickening agent.

The sorting method of the present embodiment will be explained hereinbelow in greater detail with reference to FIG. 4. FIG. 4 is a flowchart illustrating the processing flow in the sorting method of the present embodiment.

Initially, in step S201, the spent lithium ion secondary battery 100 is prepared which has the positive electrode 50 and the negative electrode 60. More specifically, for example, the lithium ion secondary battery 100 which has been used as a portable power source, vehicle drive power source, etc., is collected. The collected lithium ion secondary battery 100 can be sorted by the method according to the present embodiment in the form of a battery pack or a unit battery, but from the standpoint of preventing waste of the collected lithium ion secondary battery 100 and performing accurate sorting and reuse, it is desired that the sorting by the method of the present embodiment be performed on a unit battery.

Then, in step S202, an internal resistance of the prepared lithium ion secondary battery 100 is measured to determine initially, at the present stage, whether or not the prepared lithium ion secondary battery 100 can be reused. The temperature of the lithium ion secondary battery 100 at the time of measuring the internal resistance may be also recorded.

Then, in step S203, the measured internal resistance is compared with a preset threshold to determine whether or not the lithium ion secondary battery 100 can be reused. The threshold is set, as appropriate, as a value of a determination line for determining whether or not the battery can be reused. Where the measured internal resistance is equal to or greater than the threshold, the processing advances to the next step S204. Where the measured internal resistance is less than the threshold, the battery is reused without performing steps S204 to S206.

With step S202 and step S203, it is possible to determine the reusability of batteries with a low internal resistance without implementing the high-temperature storage step. Therefore, the high-temperature storage step and determination step are not required for such batteries and the cost can be lowered as a result of reducing the number of steps as a whole.

Where the internal resistance measured in step S202 is equal to or higher than the threshold, the lithium ion secondary battery 100 is stored for a predetermined time at a high temperature (high-temperature storage) in step S204. The investigation conducted by the inventor has demonstrated that where a battery in which salt concentration unevenness or liquid shortage has occurred is stored at a high temperature, the salt concentration unevenness or liquid shortage which has occurred inside the electrode body 20 can be at least partially recovered due to the decrease in viscosity of the electrolytic solution or as a result of convection. Therefore, the internal resistance of the battery which has increased due to the salt concentration unevenness or liquid shortage can be reduced (recovered).

In the present embodiment, a well-known high-temperature storage device such as a thermostatic chamber can be used for high-temperature storage of the nonaqueous electrolyte secondary battery.

The temperature in the high-temperature storage is not particularly limited, provided that the salt concentration unevenness or liquid shortage which has occurred inside the nonaqueous electrolyte secondary battery can be at least partially recovered. Where the temperature under the atmospheric pressure is used as a temperature indicator for the high-temperature storage, the temperature is typically 40° C. to 75° C., desirably 60° C. to 75° C. This is because where the temperature is too low, the decrease in viscosity of the electrolytic solution or the convection is unlikely to occur and the effect of eliminating the salt concentration unevenness or liquid shortage is reduced. Where the temperature is, conversely, too high, the materials used for the battery are likely to be degraded.

Then, in step S205, the lithium ion secondary battery 100 which has been stored at a high temperature is cooled (subjected to heat radiation) to a temperature equal to the temperature at the time the internal resistance was measured in step S202. A specific method can be selected from the well-known methods which are used for cooling and heat radiation as the cooling (heat radiation) means. Thus, the battery can be allowed to stay in a thermostatic chamber which is set to a temperature lower than that at the time of high-temperature storage.

An internal resistance is acquired in step S206 with respect to the lithium ion secondary battery 100 which has been stored at a high temperature. The measurement is performed by selecting a specific method from among the well-known methods for measuring the internal resistance.

The internal resistance measured in step S206 is then compared in step S207 with a preset threshold to determine whether the lithium ion secondary battery 100 can be reused. The preset threshold is determined, as appropriate, from the standpoint of whether or not the lithium ion secondary battery 100 can be reused, and a value same as that in step S203 or different therefrom may be used.

When the measured internal resistance is less than the threshold, it is assumed that the degradation of input/output of the lithium ion secondary battery 100 has been restored and the battery can be reused. Where the measured internal resistance is equal to or greater than the threshold, it is assumed that the degradation of the input/output characteristics is not sufficiently restored, which can be an indication to determine whether the reuse of the lithium ion secondary battery 100 is ceased, or whether the high-temperature storage step is implemented again.

One or a plurality of preset thresholds may be used in step S207. Where a plurality of thresholds is set, a method for reusing the lithium ion secondary batteries may be assorted according to the degree of performance degradation recovery of the batteries. For example, in the case of lithium ion secondary batteries which have been used for vehicles, it is possible to set two thresholds, namely a threshold A and a threshold B which is larger than the threshold A, and to reuse the batteries for which the internal resistance measured in step S206 is between the threshold A and the threshold B for household stationary power sources, and reuse the batteries with the internal resistance larger than the threshold B for drive power sources for vehicles.

As mentioned hereinabove, the determination of reusability can be performed with good accuracy with respect to batteries in which salt concentration unevenness or liquid shortage has occurred and which, while being inherently reusable, could be diagnosed as unreusable by the conventional techniques (for example, the diagnostic method disclosed in Japanese Patent Application Publication No. 2014-020818). Accordingly, with the method for sorting a nonaqueous electrolyte secondary battery according to the present embodiment, where or not the spent nonaqueous electrolyte secondary battery with the degraded input/output characteristics can be reused can be determined more accurately with consideration for the degradation of the input/output characteristics caused by the salt concentration unevenness or liquid shortage.

The method for sorting a nonaqueous electrolyte secondary battery according to the explained embodiment will be described hereinbelow in greater detail by using a specific example (exemplary embodiment) thereof.

Initially, 25 lithium ion secondary batteries, each battery having a positive electrode and a negative electrode, were prepared as the lithium ion secondary batteries 100 according to the present example. The lithium ion secondary batteries 100 were then repeatedly charged and discharged under predetermined conditions, and the internal resistance thereof which was measured under a 25° C. environment was adjusted to be 1.20 times (resistance increase ratio of 1.20) of the internal resistance A after the initial charging.

The prepared lithium ion secondary batteries 100 were allowed to stay inside a thermostatic chamber which was set to 60° C., and the nonaqueous electrolyte secondary batteries 100 were then taken out one by one every 2 hours (h) from the thermostatic chamber, that is, 0 h, 2 h, 4 h, . . . , till 24 h after the temperature of the lithium ion secondary batteries 100 reached 60° C., and the internal resistance of the batteries was measured again and taken as an internal resistance B.

The lithium ion secondary batteries 100 which were allowed to stay for 24 h at 60° C. were then allowed to stay under a 25° C. environment and were then removed from the thermostatic chamber one by one every 2 h. The internal resistance of the batteries was measured again and the measured internal resistance was taken as B. The ratio of the internal resistance B to the internal resistance A was determined as the resistance increase rate (B/A).

As a comparison example, the lithium ion secondary batteries were tested and the resistance increase rate was determined in the same manner as in the example, except that the temperature of the thermostatic chamber was set to 25° C. The graphs relating to the resistance increase rate and treatment time in the example and comparative example are shown in FIG. 5.

Figure 5:
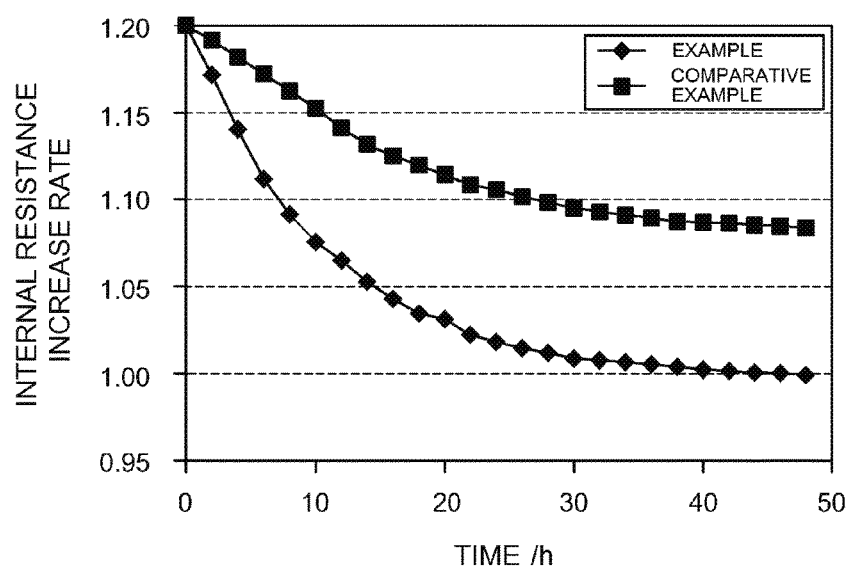
FIG. 5 is a graph illustrating the relationship between the high-temperature storage time (h) and resistance increase rate in the method for sorting a reusable nonaqueous electrolyte secondary battery according to an embodiment of the present teaching.

It is clear from FIG. 5, that in the example in which the batteries were allowed to stay for 24 h at 60° C., the resistance increase rate was effectively reduced (recovered). In particular, in the case of storage at 60° C., the resistance increase rate already decreased to about 1.05 after about 14 h, whereas in the batteries stored at 25° C., the resistance increase rate could be recovered only to about 1.08 even after 48 h. Further, in the case of storage at 60° C., the time required for the resistance increase rate to decrease to 1.10 was less than 8 h, which was ⅓ the time needed in storage at 25° C., and the increased internal resistance of the batteries could be reduced in such a time.

From the standpoint of effectively reducing the internal resistance of the battery which has increased due to the salt concentration unevenness or liquid shortage, the predetermined time for performing the high-temperature storage is not particularly limited, provided that the salt concentration unevenness or liquid shortage which has occurred inside the nonaqueous electrode secondary battery can be at least partially recovered, but this predetermined time is, for example, 8 h or more, desirably 14 h or more, more desirably 24 h or more.

Where the time of high-temperature storage is too long, other concerns, for example, concerns that the materials used in the battery are likely to be degraded, can arise. Therefore, although the predetermined time for performing the high-temperature storage is not particularly limited, provided that the salt concentration unevenness or liquid shortage which has occurred inside the nonaqueous electrode secondary battery can be at least partially recovered, the predetermined time is desirably, for example, 48 h or less.

The nonaqueous electrolyte secondary battery which has been determined by the sorting method of the present teaching to be reusable can be reused for a variety of applications. For example, where it is a lithium ion secondary battery which has been used for a vehicle, it can be advantageously reused as a drive power source to be installed on vehicles such as plug-in hybrid vehicles (PHV), hybrid vehicles (HV), and electric vehicles (EV).

The specific examples of the present teaching are described hereinabove in detail, but those examples place no limitation on the claims. Thus, the features set forth in the claims are inclusive of various changes and modifications of the above-described specific examples.

In the above-described embodiment, the nonaqueous electrolyte secondary battery (lithium ion secondary battery) uses a wound electrode body. However, the nonaqueous electrolyte secondary battery which is used in the method for sorting a reusable nonaqueous electrolyte secondary battery disclosed herein may use a stacked electrode body obtained by laminating a plurality of negative electrodes, a plurality of separators, and a plurality of positive electrodes.

Further, in the above-described embodiments, an angular nonaqueous electrolyte secondary battery (lithium ion secondary battery) is used. However, the nonaqueous electrolyte secondary battery which is used in the method for sorting a reusable nonaqueous electrolyte secondary battery disclosed herein is not limited to the angular nonaqueous electrolyte secondary battery and may be a cylindrical nonaqueous electrolyte secondary battery.

What is claimed is:

1. A method for sorting a reusable nonaqueous electrolyte secondary battery, comprising:
   a preparation step of preparing a spent nonaqueous electrolyte secondary battery having a positive electrode and a negative electrode;
   a high-temperature storage step of storing the prepared spent nonaqueous electrolyte secondary battery for a predetermined time at 40° C. to 75° C.; and
   a determination step of determining whether or not the nonaqueous electrolyte secondary battery can be reused, on the basis of an internal resistance of the nonaqueous electrolyte secondary battery after the high-temperature storage step.

2. The method for sorting a reusable nonaqueous electrolyte secondary battery according to claim 1, wherein the nonaqueous electrolyte secondary battery is stored at 60° C. to 75° C. in the high-temperature storage step.

3. The method for sorting a reusable nonaqueous electrolyte secondary battery according to claim 1, wherein the nonaqueous electrolyte secondary battery is stored for 8 hours (inclusive) to 48 hours (inclusive) in the high-temperature storage step.

4. The method for sorting a reusable nonaqueous electrolyte secondary battery according to claim 1, further comprising, before the high-temperature storage step, an advance estimation step of measuring in advance an internal resistance of the spent nonaqueous electrolyte secondary battery, wherein
   whether or not the nonaqueous electrolyte secondary battery is reusable is determined by comparing the internal resistance of the nonaqueous electrolyte secondary battery measured in the advance estimation step with a preset threshold.

5. The method for sorting a reusable nonaqueous electrolyte secondary battery according to claim 4, wherein the temperature of the nonaqueous electrolyte secondary battery at the time of measuring the internal resistance of the nonaqueous electrolyte secondary battery after the high-temperature storage step is made equal to the temperature of the nonaqueous electrolyte secondary battery at the time of measuring the internal resistance of the nonaqueous electrolyte secondary battery in the advance estimation step.

* * * * *